United States Patent
Rouch

(10) Patent No.: US 9,949,403 B2
(45) Date of Patent: Apr. 17, 2018

(54) METHOD AND DEVICE FOR COOLING EQUIPMENT PROVIDED WITH ELECTRONIC BOARDS, USING AT LEAST ONE DISTINCT FLUID-COOLED COOLING BOARD

(71) Applicant: Airbus Operations S.A.S., Toulouse (FR)

(72) Inventor: Louis Rouch, Toulouse (FR)

(73) Assignee: Airbus Operations S.A.S. (FR)

(*) Notice: Subject to any disclaimer, the term of this patent is extended or adjusted under 35 U.S.C. 154(b) by 8 days.

(21) Appl. No.: 14/971,510

(22) Filed: Dec. 16, 2015

(65) Prior Publication Data

US 2016/0183410 A1 Jun. 23, 2016

(30) Foreign Application Priority Data

Dec. 19, 2014 (FR) .................................... 14 62924

(51) Int. Cl.
*H05K 7/20* (2006.01)

(52) U.S. Cl.
CPC ..... *H05K 7/20336* (2013.01); *H05K 7/20145* (2013.01); *H05K 7/20209* (2013.01); *H05K 7/20381* (2013.01); *H05K 7/20672* (2013.01)

(58) Field of Classification Search
CPC ........... H05K 7/20218; H05K 7/20254; H05K 7/20336; H05K 7/20636; H05K 7/20672
USPC .......................................... 361/694, 695, 700
See application file for complete search history.

(56) References Cited

U.S. PATENT DOCUMENTS

| | | | |
|---|---|---|---|
| 4,931,904 A | 6/1990 | Yiu | |
| 5,191,230 A * | 3/1993 | Heung | G06F 1/20 307/141 |
| 6,510,053 B1 * | 1/2003 | Azar | H05K 1/0203 174/16.3 |
| 7,312,987 B1 * | 12/2007 | Konshak | G06F 1/20 165/80.4 |
| 7,515,418 B2 * | 4/2009 | Straznicky | H01L 23/4338 361/699 |
| 2007/0297137 A1 | 12/2007 | Glahn et al. | |

OTHER PUBLICATIONS

Search Report (Nov. 4, 2015) (FR 1462924).

* cited by examiner

*Primary Examiner* — Mukund G Patel
(74) *Attorney, Agent, or Firm* — Lerner, David, Littenberg, Krumholz & Mentlik, LLP

(57) ABSTRACT

A device for cooling electronic boards grouped together in an electronic unit. The principle is that of providing at least one distinct cooling board that is introduced into the unit in place of one or more electronic board(s). The manufacture, use and maintenance of such a cooling device are thereby greatly optimized.

12 Claims, 5 Drawing Sheets

METHOD AND DEVICE FOR COOLING EQUIPMENT PROVIDED WITH ELECTRONIC BOARDS, USING AT LEAST ONE DISTINCT FLUID-COOLED COOLING BOARD

FIELD OF THE INVENTION

The present invention relates to a method and device for fluid-cooling electronic boards arranged in equipment. It also relates to the equipment equipped with such a device and to the corresponding cooling method. More particularly, the present invention applies to on-board equipment and to an aircraft provided with such equipment.

BACKGROUND OF THE INVENTION

It is known practice for aircraft to have electronic equipment incorporating at least one electronic board. The equipment, which generally comprises units, is collectively housed in systems referred to as bays or racks. These bays or racks may be positioned close together: thus, for example, all of the avionics bays are grouped together in a region located at the front of the hold.

The present invention is not restricted to the aeronautical domain and therefore relates to any environment using electronic equipment fitted with electronic boards that require cooling. Thus, the invention also finds applications in numerous domains such as the automotive, space, maritime, industries.

The electronic boards bear electronic components that dissipate heat. Now, a unit for a piece of equipment groups together a multitude of electronic boards and a bay or rack groups together a multitude of units. It therefore follows that there is a significant localized production of heat that needs to be minimized.

The applicant company filed a Patent Application FR2964005 on Aug. 19, 2010. The application relates to electronic equipment containing at least one electronic board. The electronic board is equipped with at least one plate through which fluid circulation channels pass which channels can be connected to connectors on the equipment provided for that purpose so as to place the channels in communication with a cooling fluid inlet circuit. The plate is mounted firmly on the printed circuit board of the electronic board so as to be in contact with the electronic components that dissipate the most heat.

Document US20070297137 discloses a cooling module for an electronic equipment comprising a bladder having a chamber, fluid being disposed in the chamber wherein the bladder in its inflated state impresses the cooling module against an adjacent electronic circuit card. The cooling module is forcibly pressed against adjacent electronic circuit module providing increased physical stability to the electronic circuit card. The cooling module is in physical contact with the electronic equipment which raises issues of sealing, modulation of the force applied to the electronic circuit by the bladder in order to avoid any failure, the extraction of the cooling module which obliges to deflate the bladder and renders the system complex.

Document U.S. Pat. No. 4,931,904 discloses a cooling device in an unused circuit card mounting location and comprising cooling fans. The application provides as many cooling fans as locations to cool on the card; the fan has to be located in front of the region to cool. Cooling requires air stirring and power supply which renders the system complex.

Thus, each of the electronic boards of the equipment is provided with a cooling plate: the cooling device of a complete equipment item is therefore relatively complex in its manufacture, its use and sometimes even its maintenance because there are as many cooling plates as there are electronic boards to which these plates have to be fixed.

SUMMARY OF THE INVENTION

An aspect of the present invention may alleviate all these disadvantages and proposes a simple device for cooling a unit provided with electronic boards.

To this end, an embodiment of the present invention includes a cooling device for electronic equipment comprising a unit fitted with at least one electronic board, characterized in that it comprises a board distinct from said electronic board, referred to as cooling board, capable, using a fluid, of at least partially absorbing the heat produced by said board or boards.

As a result, the fact that a fluid-cooled cooling device is provided that is distinct from an electronic board avoids the need to add systems for fixing/integrating this device to said electronic board and all the problems resulting from the manufacture, use and maintenance thereof. That also makes it possible to avoid having to provide, for each of the electronic boards, connections on the unit for the fluidic network, thereby once again avoiding all the problems deriving from the manufacture, use and maintenance thereof, these thereby becoming greatly optimized.

The board is a specific cooling board.

According to one embodiment, the board comprises a cooling-fluid circulation channel. The channel is incorporated into or fixed to the board.

The two ends of the circulation channel forms the inlet and outlet of the channel and are connected to a cooling system.

The inlet and outlet of said channel may be positioned on the same side of the cooling board.

The channel may have a shape that includes at least one return on itself.

The channel is of a dimension such that it protrudes beyond the board.

According to another embodiment, the cooling board comprises a system operating on the heat pipe principle.

The device may comprise a device that sets the air in motion and is fixed to said board.

The present invention also relates to electronic equipment comprising a unit fitted with at least one electronic board and having at least two walls, characterized in that it comprises at least one cooling device comprising a board distinct from said electronic board and capable, using fluid, of at least partially absorbing the heat produced by said board or boards, having a configuration allowing it to be fixed at least partially to one of said walls of the unit.

Said cooling board is positioned between two boards and/or between a board and a wall of said unit.

At least one of the walls of said unit comprises at least one guideway into which said electronic board or boards and the cooling board can be inserted.

According to one embodiment, the cooling board comprises a cooling-fluid circulation channel incorporated into or fixed to it, the inlet and outlet of the channel being positioned on the same side of the board so as to allow orientation toward that wall of said unit where the electrical connections of said electronic board are made.

The present invention also relates to a cooling method for electronic equipment comprising a unit fitted with at least one electronic board and having at least two walls comprising a cooling device comprising a board distinct from said electronic board, referred to as cooling board, capable, using a fluid, of at least partially absorbing the heat produced by said board or boards having a configuration allowing attachment at least partially to one of said walls involving a step that consists in initiating the circulation of a cooling fluid from a cooling system.

The method comprises a step involving activating a device, provided on said board, for setting the air in motion.

BRIEF DESCRIPTION OF THE DRAWINGS

Further advantages and features of the invention will become apparent from reading the description which follows of the device according to the invention, which is given by way of nonlimiting example with reference to the attached drawings in which.

DETAILED DESCRIPTION

Figure 1:
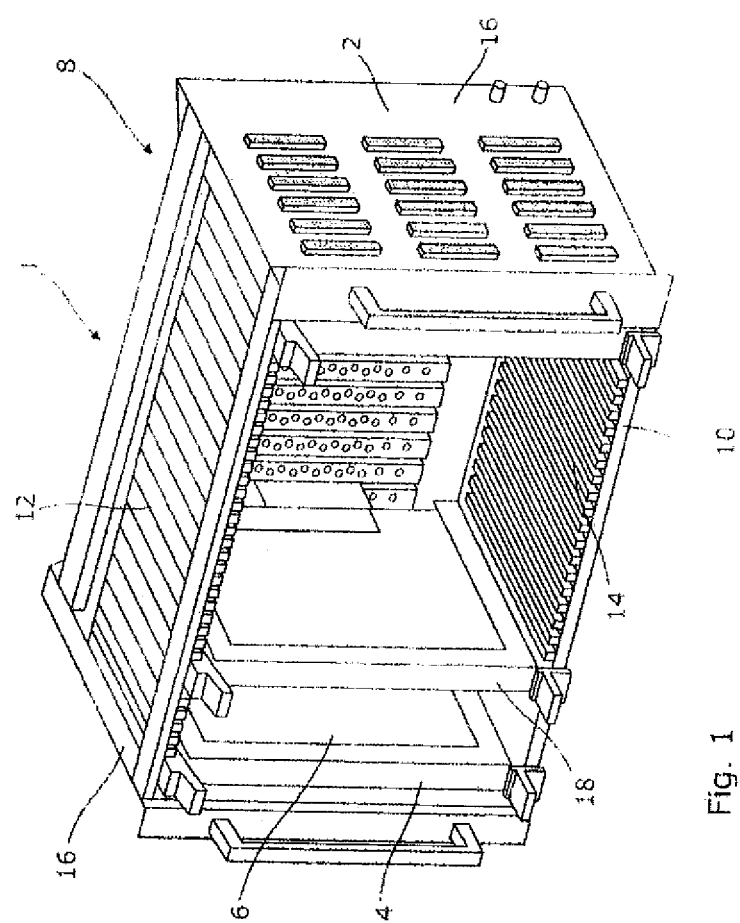
FIG. 1 is a perspective view of one embodiment of equipment fitted with a cooling device according to an embodiment of the present invention.

As FIG. 1 shows, electronic equipment 1 comprises a unit 2, box, case, also known by the English expression packaging: throughout the remainder of the description, the term "unit" will be used. Housed inside the unit 2 is at least one electronic module 4 comprising an electronic board 6. According to another possible embodiment which has not been illustrated, the board 6 is housed directly in the unit 2 without the intermediary of a module 4. The unit 2 has a structure that allows the modules 4/boards 6 to be fixed, transported, stored or protected and/or that allows the modules 4/boards 6 to interface with other entities such as, for example, other units 2 or a bay. The unit 2 generally has a parallelepipedal structure having five or six walls: the modules/boards are thus surrounded by said walls which thereby protect them.

In the embodiment illustrated in FIG. 1, the unit comprises 5 walls fixed to one another by any type of known means. In the embodiment illustrated, the board 6 is introduced into the module 4 of which one of the faces juxtaposed with the corresponding faces of the other modules 4 form a sixth wall of the unit 2. The unit 2 may be embodied in other ways and, for example, may comprise an L-shaped base and a U-shaped cap intended to fit over the L-shaped base to form a parallelepipedal structure. The unit 2 may also have just two faces, perpendicular to one another to form an L. If the unit is confined to a structure with just two faces, the boards are not enveloped by the structure of the unit but are enveloped by that of the bay into which the units are introduced. There are numerous possible embodiments so these will not all be illustrated: the present invention may be applied to any type of unit 2.

Throughout the remainder of the description, it will be assumed that the unit 2 is in the position of use, namely laying horizontally with respect to the ground: in that case, the electronic boards 6 stand in vertical planes.

As shown in FIG. 1, the unit 2 comprises a rear wall 8 for the electrical connection of the electronic boards 6, a bottom wall 10 also known as the backplane, an upper wall 12 and two lateral walls 16. The lower 10 and upper 12 walls bear guideways 14 that guide and support the electronic boards 4. The lower wall 10 allows the unit 2 to be fixed to a bay or any other entity incorporating units of this type. It may be that attachment to the bay is via a wall other than the lower wall 10. It may also be that attachment is via a number of walls, which may or may not include the wall 10.

Figure 2:
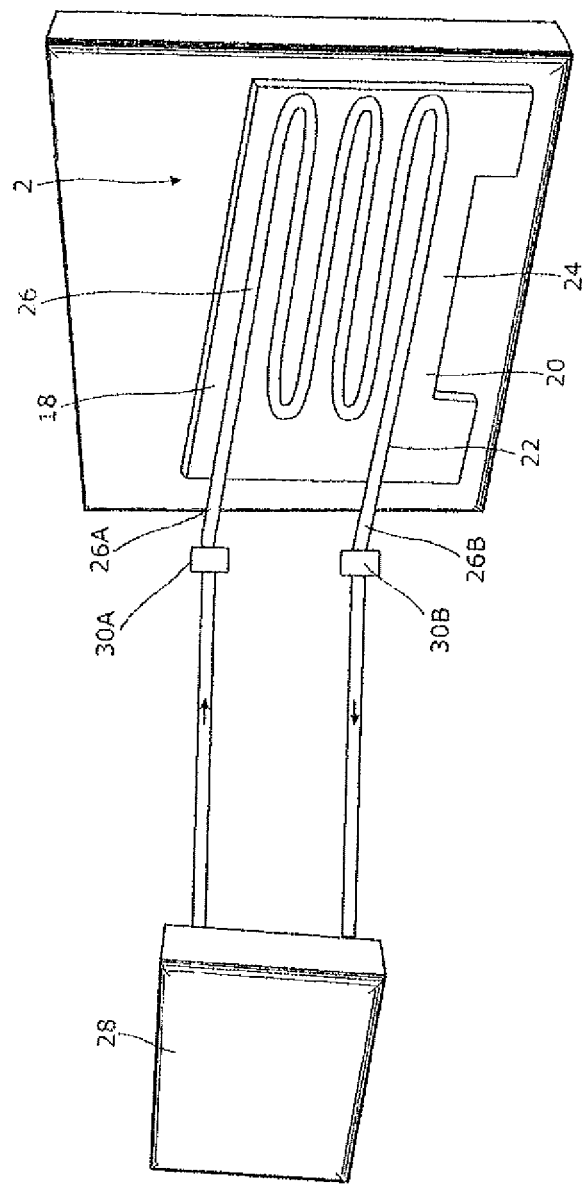
FIG. 2 is a schematic view of a first embodiment of the cooling device according to the invention.

The present invention relates to a device for cooling the electronic unit 2 that holds the collection of electronic boards 6. As depicted in FIG. 2, one of the principles of the invention is to provide at least one cooling board 18 distinct from the electronic boards 6 provided in the equipment and referred to throughout the remainder of the description as a cooling board 18. It is considered to be distinct because there is no physical contact provided between the cooling board 18 and the neighboring electronic boards 6. The cooling board 18 is separated from the electronic boards and no device for connection between the cooling board 18 and the electronic boards 6 is provided. The cooling board 18 and each of the electronic boards 6 form physically independent entities. In cases in which the board 18 forms an integral part of a module 4, the modules 4 of the electronic boards 6 and of the cooling boards 18 are likewise distinct, separated and physically independent. The cooling board 18 is plugged into a position in the unit provided for an electronic board 6/module 4. There is no specific location for the cooling board: the unit requires no adaptation, especially in the backplane 10. In the example illustrated, the cooling board 18 is inserted into a guideway 14 in the same way as a module 4.

In addition, said cooling board 18 is a specific board: its sole function is to cool the electronic boards between or near which it is located. It may be that it provides additional functions; in which case all of these functions are aimed solely at improving the operation of the electronic boards located in the same unit 2, such as electromagnetic compatibility for example, as will be seen later on. As a result, it bears no electronic components or bears only electronic components intended to assure the operation of the cooling systems provided on the board 18 or of ancillary functions.

Figure 3:
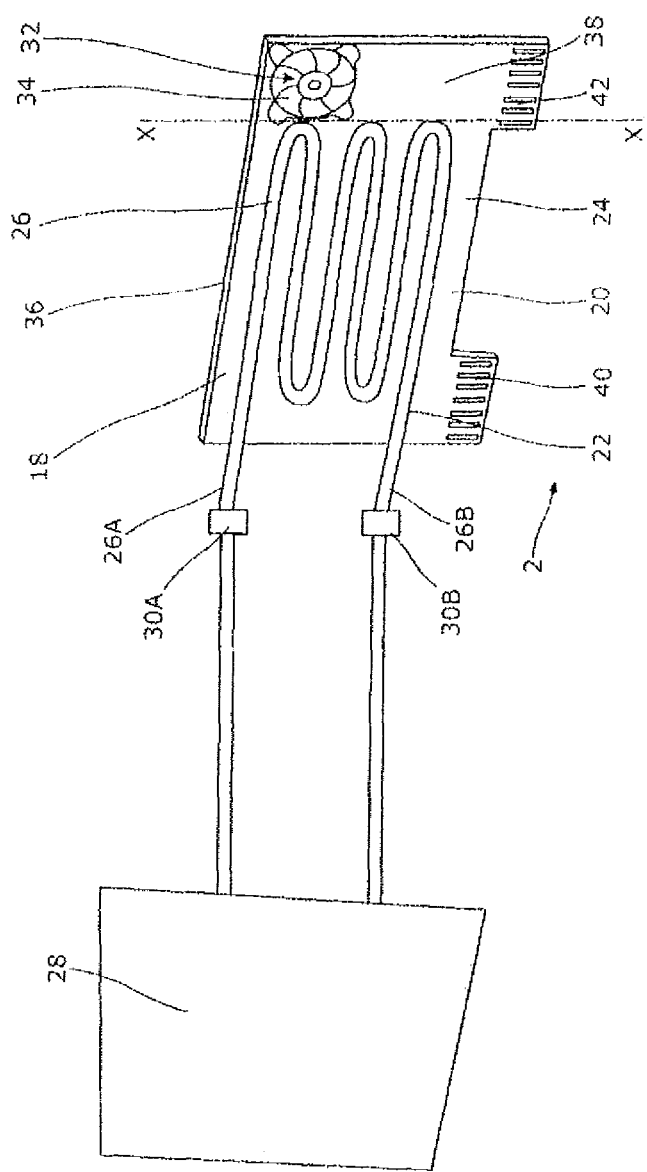
FIG. 3 is a schematic view of a second embodiment of the cooling device according to the invention.
Figure 4:
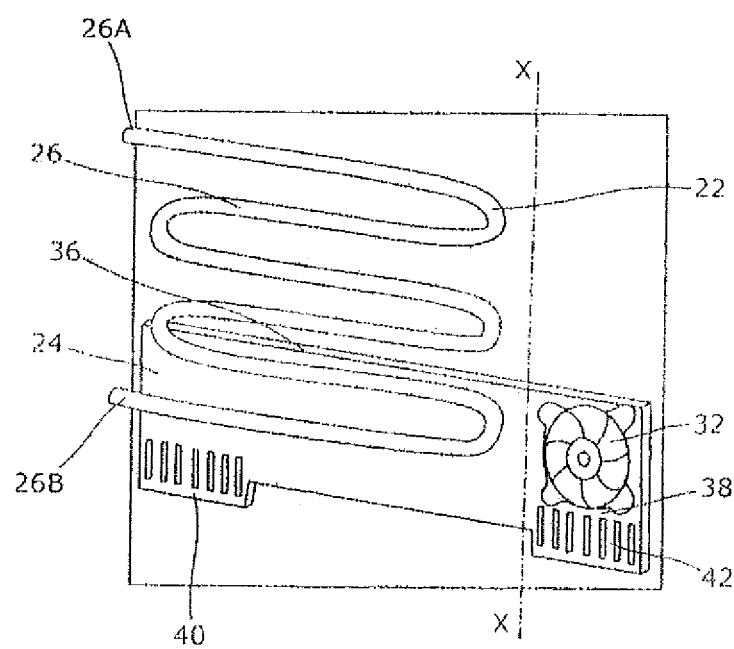
FIG. 4 is a schematic view of a third embodiment in which only the cooling board according to the invention is depicted.

As depicted in FIGS. 2 to 4, which illustrate three embodiments of the invention, the board 18 comprises a support 20 and a cooling fluid circulation channel 22. The fluid can be in any state such as a gaseous, liquid monophase state or may alternatively be in a two-phase state. The fluid may for example be a liquid such as water. The support 20 takes the form of a rigid plate 24. Any type of material can be used from which to make the plate 24. In cases in which the channel 22 is formed in the thickness of the support 20 it is necessary to provide a fluidtight material unless a layer of fluidtight material is applied to the internal wall of the channel. It is also possible to use the same materials as are used for the electronic boards, such as epoxy resin or ceramic for example. Because the cooling board 18 is specific and distinct, it is possible also to use materials other than those used for the electronic boards, such as plastic for example.

Because the cooling board 18 is inserted between electronic boards 6, the material used can be chosen so that the board 18 improves electromagnetic compatibility. It may thus for example be made of galvanized or stainless steel, aluminum or fiberglass.

The plate 24 may adopt any type of shape that allows it to be fixed at least partially directly or indirectly to a wall of the unit 2 in which it is housed. It possesses the same fixing systems as a module 4/a board 6 so that it can be inserted into existing units 2 without the need to adapt the latter.

According to one possible embodiment of the invention, the plate 24 is rectangular and has a thickness that allows it to be housed and to slide in the guideways 14 of the unit 2 which are provided for that purpose. Mechanical elements of any known type are provided on the plate 24 for fixing it to at least one of the walls of the unit 2 once it has been installed in the guideway.

The shape of the channel and any specific material that may have been used for the walls of the channel are such that they allow optimum diffusion of the temperature of the fluid toward the electronic boards of the same unit 2. The channel 22 extends over the entire surface of the board (as illustrated by the first embodiment in FIG. 2) or over just part of this surface (as illustrated by the second and third embodiments in FIGS. 3 and 4), so as to leave space for one or more other cooling systems.

The channel may take the form of innumerable shapes with returns on themselves, it being possible for the returns to have curvatures or not; the directions followed by the channel are numerous, diverse and varied.

According to the three embodiments of the invention which have been depicted in FIGS. 2 to 4, the channel 22 is formed by a tube 26 attached to the plate 24. The tube 26 is fixed to the plate by any known type of means, and, for example, by bonding and/or using mechanical retention means provided on the plate. The shape and composition of the tube are chosen so that the temperature of the cooling fluid passing through it is optimally diffused. The material or materials used to form the channel 22 may for example be aluminum, copper, steel. The tube 26 has a sinuous shape so that it spreads over the surface of the plate 24. In FIGS. 2 to 4, the tube is bent back on itself on numerous occasions to form an S or even a succession of S-bends. In the first embodiment illustrated in FIG. 2, the tube 26 spreads over the entire surface area of the plate 24.

In the three embodiments illustrated in FIGS. 2 to 4, the two ends 26A, 26B of the tube 26 forming the inlet and outlet of the channel 22 are parallel and protrude beyond the plate 24 on the same side thereof. According to other forms of embodiment that have not been illustrated, it may be that the ends of the tube emerge from the plate via two different sides and, for example, a lateral side facing the rear wall 8 of the unit and a lower side facing the backplane 10 of the unit.

The channel 22 is connected to a cooling system 28 that allows the cooling fluid to be supplied and injected into it. In the embodiment illustrated in FIG. 2, the cooling system 28 injects the cooling fluid into the tube 26. The ends 26A, 26B of the tube 26 are connected to the cooling system 28. Connection interfaces 30A, 30B between the ends 26A, 26B of the tube 26 and the cooling system 28 are provided. The interfaces 30A, 30B are situated, for example, at the rear wall 8 of the unit 2.

The interface 30 may thus take the form of a passage in the wall 8 through which passage either the tube 26 or the cooling system 28 is inserted, the connection between the tube and the cooling system then taking place no longer at a wall of the unit but some distance therefrom.

According to the second and third embodiments of the invention which have been illustrated in FIGS. 3 and 4, the tube 26 extends over just part of the surface of the plate 24 so as to leave some surface area available for installing, in addition to the device that allows the temperature of a cooling fluid to diffuse, a device 32 that allows air to be circulated to encourage the transfer of heat energy.

A through-opening 34 is provided in the plate 24 into which the device 32 of fan type is inserted. The fan 32 is fixed by any type of known mechanical means to the plate 24. The fan may be positioned at any point on the plate. The surface of the plate is therefore shared to allow the integration of the channel 22 for the circulation of cooling fluid and of the device 32 for causing the air to circulate. In the example illustrated, the surface of the plate is split into two distinct zones 36, 38 separated by a vertical transverse axis X-X. In the zone 36, the tube 26 extends over the entire surface thereof. In the zone 38 in the second embodiment illustrated in FIG. 3, the fan 32 is positioned on the top of the plate 24, over the entire width of the zone 38. Thus, since hot air has a tendency to rise, the circulation of the air is optimum.

The device 32 for circulating the air requires an electrical power supply. The plate has two appendages 40, 42 the function of which is to connect the device 32 electrically to a power system. Electrical connections are incorporated into the board to place the device 32 in an electrical connection with the appendages 40, 42.

One of the walls of the unit 2 and, for example, the backplane 10 is provided with connection systems facing each other at each of the guideways 14 or just part of these.

Additional cooling systems may be combined with those described above. The surface of the plate 24 would then be configured to accommodate these.

According to the third embodiment illustrated in FIG. 4, the surface of the plate 24 is reduced so that part of the tube 26 protrudes beyond the outside of the plate and is unsupported. In that case, the tube 26 needs to be made of a material that is rigid enough that it can transport the fluid without deforming. In this embodiment, as the plate has an optimized surface area the weight of the board is reduced. The plate 24 could be made of a material such as graphene.

Figure 5:
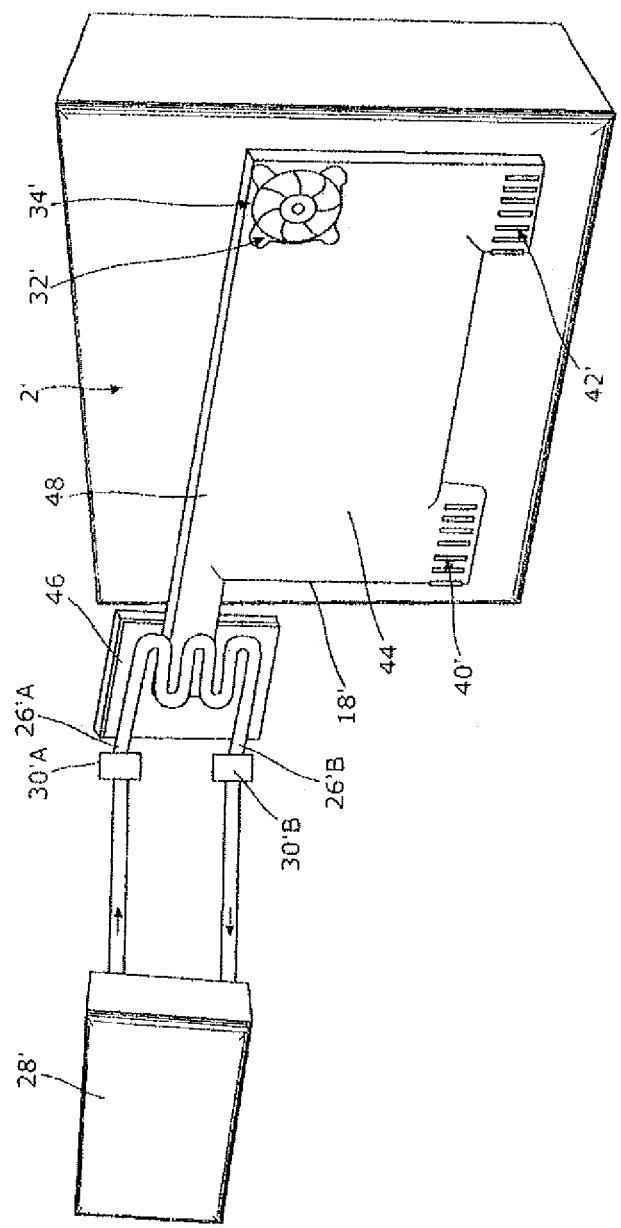
FIG. 5 is a schematic view of a fourth embodiment of the cooling device according to the invention.

According to a fourth embodiment illustrated in FIG. 5, the cooling board 18' takes the form of a fluidtight system operating on the heat pipe principle. Fluidic phenomena that encourage exchanges of heat with the heat exchanger 46 occur in the enclosure 44. The heat exchanger 46 is connected to a cooling system 28' of the same type as the one introduced hereinabove. As before, a large proportion of the heat produced by the board or boards 6 is absorbed by the chamber 44 of the cooling board 18'.

The support 44 may take the form of a rigid hollow plate 48. Any type of fluidtight material can be used from which to make the plate 48. Any type of non-fluidtight material can also be used if the interior face thereof is covered with a fluidtight material.

Because the cooling board 18' is inserted between electronic boards 6, the material used for the board or the coating thereof may be chosen so that the board 18' improves electromagnetic compatibility. It may thus for example be made of galvanized or stainless steel, of aluminum or of fiberglass.

The plate 48 may adopt any type of shape that allows at least partial direct or indirect attachment to a wall of the unit 2 in which it is housed.

According to one possible embodiment of the invention, the plate 48 is rectangular and has a thickness that allows it to be lodged and to slide in the guideways 14 of the unit 2 which are provided for that purpose. Mechanical elements of any known type are provided on the plate 48 in order to secure it to at least one of the walls of the unit 2 once it is installed in the guideway.

In addition to the device that allows the temperature of a cooling fluid to diffuse, a device 32' allowing air to be circulated so as to encourage the transfer of heat energy is provided.

A through-opening 34' is made in the board 18' and has the device 32' of fan type inserted therein. The fan 32' is fixed by any type of known mechanical means to the board 18' in a zone distinct from the chamber 44 forming the heat pipe. The fan can be positioned at any point, preferably in a peripheral zone in order to leave the central zone to act as a heat duct. The surface of the board is then shared to allow the chamber 44 forming the heat pipe and the device 32' for circulating the air to be integrated. In the example illustrated in FIG. 5, the fan 32' is positioned at the top of the board 18'. Thus, because hot air has a tendency to rise, the circulation of the air is optimized.

The device 32' for circulating the air requires an electrical power supply. The plate has two appendages 40', 42' the function of which is to connect the device 32' electrically to a power system. Electrical connections are incorporated into the board to place the device 32' in an electrical connection with the appendages 40', 42'.

One of the walls of the unit 2 and, for example, the backplane 10 is provided with connection systems facing each other at each of the guideways 14 or just part of these.

Additional cooling systems may be combined with those described above. The surface of the board would then be configured to accommodate these.

The cooling device works as follows.

One or more cooling boards 18 are introduced into the unit 2 between electronic boards 6.

In the first, second and third embodiments, the ends 26A, 26B of the cooling tube 26 are connected to interfaces 30A, 30B provided for that purpose. In the fourth embodiment illustrated in FIG. 5, it is the ends 26'A and 26'B of a serpentine coil of the exchanger 46 which are connected via interfaces 30'A, 30'B to allow connection to the cooling system 28'.

In all of the embodiments, the appendages 40, 42 connect to the systems provided in the unit 2 for accepting them. Inserting the cooling boards 18 is quick and easy, just like inserting the electronic boards 6/modules 4, as too is uninstalling them.

When the unit 2 is switched on, namely when at least one board 18 and/or 18' is switched on, the cooling system 28, 28' and/or the power supply systems are switched on. Depending on the boards used or the expected production of heat by each of them, it is possible to provide a specific electronic control system which determines the cooling board or boards to select and which cooling system or systems to bring into operation for cooling said boards or boards.

The control system external to the board allows operation of several cooling systems to be coupled or not.

The cooling system 28, 28' when activated allows cooling of the fluid that circulates through the board 18, 18'. The low-temperature fluid at least partially absorbs the heat produced by the nearby electronic board or boards and allows the temperature of the electronic components of the nearby boards 6 to be lowered.

It is also possible not to have a control system and to incorporate one or more thermostats which trigger the starting of the cooling systems.

Starting up the device 32 allows the hot air surrounding the electronic boards 6 in the vicinity to be set in circulation and discharged through openings provided on one, several or all of the walls of the unit 2. It also speeds up the diffusion of the cold air produced by the channel 22 or the chamber 44.

Thus, the cooling board 18, 18' allows, through an independent physical structure, the cooling of the electronic boards of the same unit 2. The fact that a distinct and specific board is provided makes for easier mass production, lower cost, cooling suited to the use of each of the boards or to the expected production of heat, and quick and easy installation/uninstalling. Cooling system maintenance also becomes simpler and without operating losses because all that is required is for the cooling board 18 to be uninstalled and replaced by another while repairs are being carried out. Providing a form of board provided with fixing means identical or similar to those of a module 4/board 6 means that existing units can be used.

The present invention is not restricted to the aeronautical domain. The cooling device according to the present invention could be used in many other technical domains in which it might be advantageous to have a cooling device of this type.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A cooling device for electronic equipment comprising:
   a unit fitted with at least one electronic board;
   a board distinct and thermally conductively spaced apart from said electronic board, referred to as cooling board, the cooling board comprising a fluid circulation channel configured for using a fluid to at least partially absorb the heat produced by said at least one electronic board, the fluid circulation channel extending at least partially over a surface of the cooling board; and
   a device setting air in motion and fixed to said board,
   wherein the cooling board comprises an appendage configured to connect electrically the device on the cooling board to a power system.

2. The cooling device according to claim 1, wherein first and second ends of the fluid circulation channel forms the inlet and outlet of the channel and are connected to a cooling system.

3. The cooling device according to claim 2, wherein the inlet and outlet of said fluid circulation channel are positioned on the same side of the cooling board.

4. The cooling device according to claim 1, wherein the fluid circulation channel has a shape that includes at least one U-turn.

5. The cooling device according to claim 1, wherein the fluid circulation channel is of a dimension such that the fluid circulation channel protrudes beyond the board.

6. The cooling device according to claim 1, wherein the cooling board comprises a system operating on the heat pipe principle.

7. An electronic equipment comprising:
- a unit fitted with at least one electronic board and having at least two walls;
- at least one cooling device comprising a board distinct and thermally conductively spaced apart from said electronic board, the at least one cooling board comprising a fluid circulation channel extending at least partially on a surface of the at least one cooling board and configured for using a fluid to at least partially absorb the heat produced by said at least one electronic board, and having a configuration allowing the at least one cooling device to be fixed at least partially to one of said walls of the unit, the cooling board further comprising a device, provided on said cooling board, for setting the air in motion,
- wherein said cooling board is positioned between two boards and/or between a board and a wall of said unit.

8. The electronic equipment according to claim 7, wherein at least one of the walls of said unit comprises at least first and second guideways into which said at least one electronic board and the cooling board are inserted, respectively.

9. The electronic equipment according to claim 7, wherein the inlet and outlet of the fluid circulation channel are positioned on the same side of the board so as to allow orientation toward that wall of said unit where the electrical connections of said electronic board are made.

10. A cooling method for electronic equipment comprising a unit fitted with at least one electronic board and having at least two walls comprising a cooling device comprising a board distinct and thermally conductively spaced apart from said electronic board, referred to as cooling board, the cooling board comprising a fluid circulation channel configured for using a fluid to at least partially absorb the heat produced by said board or boards having a configuration allowing attachment at least partially to one of said walls, the fluid circulation channel extending at least partially over a surface of the cooling board, the method comprising: initiating a circulation of a cooling fluid from a cooling system through the fluid circulation channel,
- wherein the cooling board comprises an appendage configured to connect electrically a device on the cooling board to a power system, and
- wherein the device on the cooling board comprises a device setting air in motion and fixed to said board.

11. The cooling method according to claim 10, further comprising activating the device, provided on said board, for setting the air in motion.

12. The electronic equipment according to claim 7, wherein the cooling board comprises a through-opening, the device for setting air in motion being inserted into the through-opening.

* * * * *